(12) United States Patent
Graf et al.

(10) Patent No.: US 10,734,346 B2
(45) Date of Patent: *Aug. 4, 2020

(54) METHOD OF MANUFACTURING CHIP-ON-CHIP STRUCTURE COMPRISING SINTERTED PILLARS

(71) Applicant: INTERNATIONAL BUSINESS MACHINES CORPORATION, Armonk, NY (US)

(72) Inventors: Richard S. Graf, Gray, ME (US); Jay F. Leonard, Williston, VT (US); David J. West, Essex Junction, VT (US); Charles H. Wilson, Essex Junction, VT (US)

(73) Assignee: ELPIS TECHNOLOGIES INC., Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/250,429

(22) Filed: Jan. 17, 2019

(65) Prior Publication Data

US 2019/0148328 A1 May 16, 2019

Related U.S. Application Data

(63) Continuation of application No. 14/736,943, filed on Jun. 11, 2015, now Pat. No. 10,340,241.

(51) Int. Cl.
*H01L 23/00* (2006.01)
*H01L 25/065* (2006.01)
(Continued)

(52) U.S. Cl.
CPC ............ *H01L 24/17* (2013.01); *H01L 24/11* (2013.01); *H01L 24/13* (2013.01); *H01L 24/16* (2013.01); *H01L 24/81* (2013.01); *H01L 25/0657* (2013.01); *H01L 25/50* (2013.01); *H01L 21/563* (2013.01); *H01L 23/562* (2013.01); *H01L 24/14* (2013.01); *H01L 2224/1181* (2013.01); *H01L 2224/11332* (2013.01);
(Continued)

(58) Field of Classification Search
None
See application file for complete search history.

(56) References Cited

U.S. PATENT DOCUMENTS 5,156,697 A   10/1992   Bourell et al.
5,466,635 A   11/1995   Lynch et al.
(Continued)

OTHER PUBLICATIONS

"List of IBM Patents or Patent Applications Treated as Related", dated Apr. 25, 2019, 1 page.
(Continued)

*Primary Examiner* — Daniel Whalen
(74) *Attorney, Agent, or Firm* — Michael McCartney; Andrew M. Calderon; Roberts Calderon Safran & Cole, P.C.

(57) ABSTRACT

Sintered connection structures and methods of manufacture are disclosed. The method includes placing a powder on a substrate and sintering the powder to form a plurality of pillars. The method further includes repeating the placing and sintering steps until the plurality of pillars reach a predetermined height. The method further includes forming a solder cap on the plurality of pillars. The method further includes joining the substrate to a board using the solder cap.

15 Claims, 3 Drawing Sheets

(51) Int. Cl.
*H01L 25/00* (2006.01)
*H01L 21/56* (2006.01)

(52) U.S. Cl.
CPC ............ *H01L 2224/11442* (2013.01); *H01L 2224/11505* (2013.01); *H01L 2224/11552* (2013.01); *H01L 2224/11901* (2013.01); *H01L 2224/13005* (2013.01); *H01L 2224/13017* (2013.01); *H01L 2224/13082* (2013.01); *H01L 2224/13147* (2013.01); *H01L 2224/13184* (2013.01); *H01L 2224/14135* (2013.01); *H01L 2224/14155* (2013.01); *H01L 2224/16059* (2013.01); *H01L 2224/16145* (2013.01); *H01L 2224/16225* (2013.01); *H01L 2224/16227* (2013.01); *H01L 2224/1703* (2013.01); *H01L 2224/17051* (2013.01); *H01L 2224/17104* (2013.01); *H01L 2224/81191* (2013.01); *H01L 2224/81203* (2013.01); *H01L 2224/81815* (2013.01); *H01L 2224/81986* (2013.01); *H01L 2224/94* (2013.01); *H01L 2225/06513* (2013.01); *H01L 2225/06517* (2013.01); *H01L 2225/06555* (2013.01); *H01L 2225/06568* (2013.01); *H01L 2924/20645* (2013.01)

(56) References Cited

U.S. PATENT DOCUMENTS

| | | | |
|---|---|---|---|
| 6,084,303 A | 7/2000 | Audoux et al. | |
| 6,084,308 A | 7/2000 | Kelkar et al. | |
| 6,642,080 B1 | 11/2003 | Ference et al. | |
| 7,569,935 B1 | 8/2009 | Fan | |
| 8,136,237 B2 | 3/2012 | Val | |
| 8,258,055 B2 | 9/2012 | Hwang et al. | |
| 9,136,143 B2 | 9/2015 | Yu et al. | |
| 9,904,814 B2 * | 2/2018 | Gonzalez | G06F 21/75 |
| 10,340,241 B2 * | 7/2019 | Graf | H01L 24/17 |
| 2003/0183944 A1 | 10/2003 | Taniguchi | |
| 2004/0173891 A1 | 9/2004 | Imai et al. | |
| 2009/0236732 A1 | 9/2009 | Yu et al. | |
| 2010/0059244 A1 | 3/2010 | Ishii | |
| 2011/0018113 A1 | 1/2011 | Huang et al. | |
| 2011/0003470 A1 | 6/2011 | Burgess et al. | |
| 2012/0049342 A1 | 3/2012 | Rathburn | |
| 2012/0112327 A1 | 5/2012 | Pagaila et al. | |
| 2013/0270419 A1 | 10/2013 | Singh et al. | |
| 2014/0077359 A1 | 3/2014 | Tsai et al. | |
| 2015/0001704 A1 | 1/2015 | Lu et al. | |
| 2015/0137354 A1 | 5/2015 | Foong et al. | |
| 2016/0365328 A1 | 12/2016 | Graf et al. | |
| 2016/0365329 A1 | 12/2016 | Graf et al. | |
| 2017/0109551 A1 | 4/2017 | Gonzalez | |

OTHER PUBLICATIONS

Specification "Chip-On-Chip Structure and Methods of Manufacture" and Drawings in related U.S. Appl. No. 16/388,113, filed Apr. 18, 2019, 17 pages.

J. Sutanto et al., "Development of chip-on-chip with face to face technology as a low cost alternative for 30 packaging," Electronic Components and Technology Conference {ECTC), 2013, pp. 955-965.

Z. Li et al , "Design and package technology development of Face-to-Face die stacking as a low cost alternative for 30 IC integration," 64th Electronic Components and Technology Conference {ECTC), 2014, pp. 338-341.

Y. P. Kathuria, "Selective laser sintering of metallic powder for microfabrication technology," International Symposium on Micromechatronics and Human Science, 1997. pp. 41-47.

H. H. Sigmarsson et al., "Selective laser sintering of multilayer, multimaterial circuit components," MTT-S International Microwave Symposium, 2006. pp. 1788-1791.

C. A. Terrazas et al., "Multi-material metallic structure fabrication using electron beam melting," The International Journal of Advanced Manufacturing Technology, vol. 71, No. 1-4. 2014, pp. 33-45.

List of IBM Patents or Patent Applications Treated as Related dated Jan. 16, 2019, 1 page.

Notice of Allowance for related U.S. Appl. No. 14/736,943 dated Jan. 18, 2019, 5 pages.

Office Action for the Related U.S. Appl. No. 15/083,852 dated Jan. 30, 2019, 14 pages.

Office Action in related U.S. Appl. No. 16/388,113 dated Aug. 27, 2019, 7 pages.

Final Office Action in related U.S. Appl. No. 15/083,852 dated Sep. 5, 2019, 11 pages.

Notice of Allowance in related U.S. Appl. No. 16/388,113 dated Jan. 10, 2020, 8 pages.

\* cited by examiner

METHOD OF MANUFACTURING CHIP-ON-CHIP STRUCTURE COMPRISING SINTERTED PILLARS

FIELD OF THE INVENTION

The invention relates to semiconductor structures and, more particularly, to sintered connection structures and methods of manufacture.

BACKGROUND

Current solder bump connection technologies can be costly and are limited by masking and plating processes. For example, fabrication processes constrain the thickness of copper pillars to about 75 um tall due to the aspect ratio of the photoresist expose and strip process.

SUMMARY

In an aspect of the invention, a method comprises placing a powder on a substrate and sintering the powder to form a plurality of pillars. The method further comprises repeating the placing and sintering steps until the plurality of pillars reach a predetermined height. The method further comprises forming a solder cap on the plurality of pillars. The method further comprises joining the substrate to a board using the solder cap.

In an aspect of the invention, a method comprises: placing a wafer in a chuck and coating the wafer with a plurality of layers of conductive powder, followed by a laser sintering after each coating to form conductive pillars of a predetermined height; forming a solder cap, on the conductive pillars; removing non-sintered powder by a cleaning process; joining a chip to the wafer between the conductive pillars; and joining the wafer to a board by a bonding process of the solder cap of the conductive pillars to the board.

In an aspect of the invention, a structure comprises: a plurality of sintered copper pillars with a solder cap, comprising a height of approximately 75 µm or greater on a wafer; a chip joined to the wafer, between a plurality of sintered copper pillars; a laminate board joined to the wafer by the solder cap of the plurality of sintered copper pillars or other conductive material; and an underfill material bonding the chip, the wafer and the laminate board.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to sintered connection structures and methods of manufacture. In more specific embodiments, the connection structures are fine pitched structures, which enable chip beneath chip stacking. In even more specific embodiments, the fine pitched structures are pillars with higher standoff (than conventional structures) to allow additional joining of chips. The pillars can be copper pillars with a solder cap, fabricated using fine pitch selective laser sintering (e.g., a version of 3D printing). In embodiments, the pillars can also be composed of alloys, with multiple heights and shapes.

In embodiments, the connection structures described herein can be used for under bump metallurgy (UBM) deposition, amongst other structures. In further embodiments, the fabrication processes and resulting structures can be used to form discrete devices such as inductors, resistors, RF antennas and RF shielding, as well as micro bump printing for stacked chips.

Advantageously, the fabrication processes enable formation of pillars that extend beyond 75 um in height, up to approximately 500 um in height or more. In fact, the fabrication processes and resulting structures provide controlled bump profiles for strain reduction. Also, the fabrication processes allow for controlled (e.g., software controlled) printing of binary and trinary metal systems on the wafer without additional plating steps, e.g., eliminating the need for masking and lithography processes. Accordingly, the fabrication processes described herein significantly reduce overall fabrication costs and time. Also, the fabrication processes described herein provide the ability to selectively develop different sized and shaped solder bumps on the same wafer.

Figure 1:
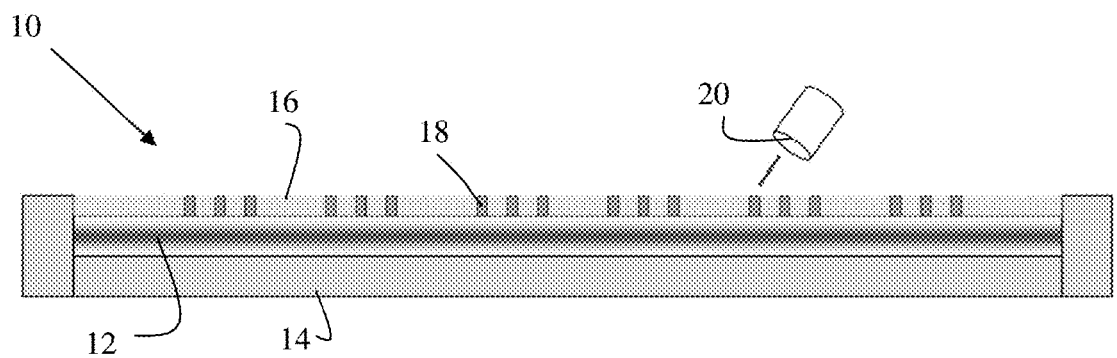
FIGS. 1-5 show fabrication processes and respective structures in accordance with aspects of the invention.

FIG. 1 shows a structure and respective fabrication processes in accordance with aspects of the invention. The structure 10 includes a wafer or substrate 12 mounted in a chuck 14. In embodiments, the substrate 12 can be a semiconductor material composed of any suitable material including, but not limited to, Si, SiGe, SiGeC, SiC, Ge alloys, GaAs, InAs, InP, and other III/V or II/VI compound semiconductors.

As further shown in FIG. 1, a powder 16 is formed on the substrate 12. In embodiments, the powder 16 is a copper powder; however, the present invention contemplates the use of any conductive material such as tungsten or other metals or metal alloys. In further embodiments, the powder 16 can be an insulator material or even a polymer or nylon as examples. The powder 16 can be deposited to a thickness from about 1 micron to about 25 microns or more in each pass, and preferably about 5 microns in height. Subsequent to each coating of the powder deposition, a software controller laser 20 sinters portions of the powder to form pillars 18. In embodiments, the sintering is provided in an inert atmosphere.

The pillars 18 can be approximately 5 microns to greater than 200 microns in diameter and, in embodiments, can be provided in many different shapes as described further herein. In embodiments, the laser 20 can be a $CO_2$ laser or Yb laser, as examples, with a pulse of power or energy high enough to sinter the powder to form the pillars 18. In embodiments, the power or energy of the pulse should melt but not reflow the powder 16, noting that the power or energy of the pulse will thus vary depending on the material of the powder.

Figure 2:
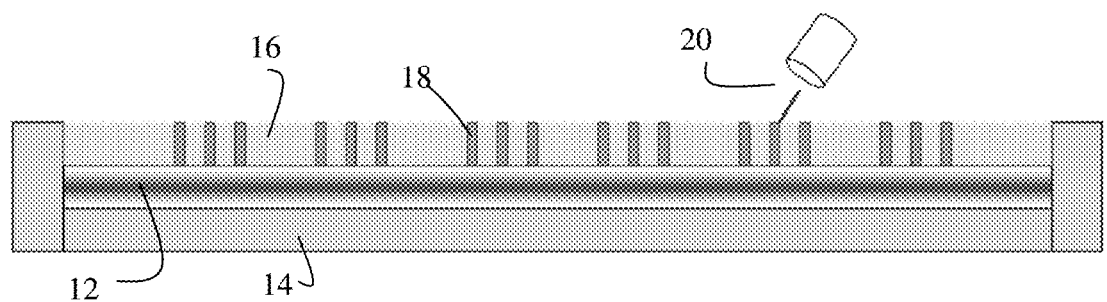

As further shown in FIG. 2, additional powder 16 is formed on the substrate 12. The powder 16 can be deposited to an additional thickness from about 3 microns to about 25 microns in this pass, and preferably about 5 microns in height. Subsequent to the powder deposition, the laser 20 can sinter portions of the additional powder to continue the formation of the pillars 18 to a greater height, as already described herein. In embodiments, the deposition and sintering processes can continue until the pillars extend beyond 75 um in height, up to approximately 500 um in height, which can enable a chip under chip configuration.

Figure 3:
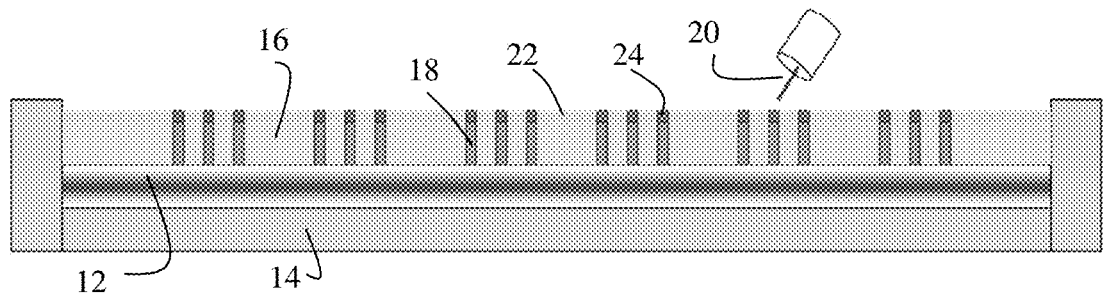

In FIG. 3, additional powder 22 is formed on the upper layer of the powder 16. In specific embodiments, the additional powder 22 is a solder powder coated on the powder 16. As previously described, the additional powder 22 undergoes a sintering process. This sintering process will form a solder connection 24. The solder connection 24 can be of varying height, depending on the particular application.

Figure 4:
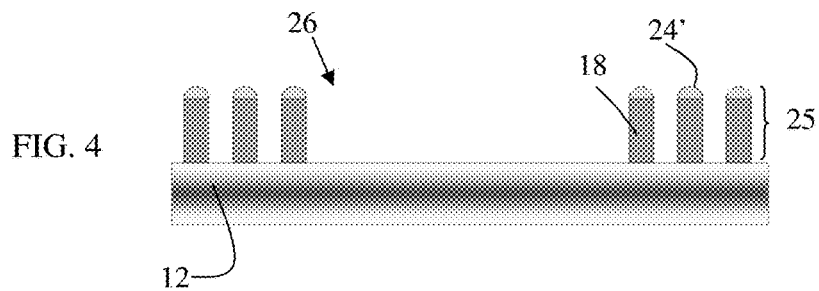

In FIG. 4, any non-sintered powder (e.g., powder 16 and powder 22) is removed using conventional processes. For example, the non-sintered powder can be removed by a cleaning process such as a blowing process. After the removal of the non-sintered powder, pillars 25 will remain on the substrate 12. In embodiments, the pillars 25 can be a combination of materials formed to a height of approximately 500 um or more, which is not possible with conventional plating processes.

After a desired height is obtained, the structure will undergo a reflow process to round the pillars 25 and, more particular, to form a solder cap 24' (e.g., solder cap). The wafer can then be diced to form separate chips 26. In embodiments, the dicing can be performed in any conventional manner, e.g., scribing and breaking, by mechanical sawing or by laser cutting.

Figure 5:
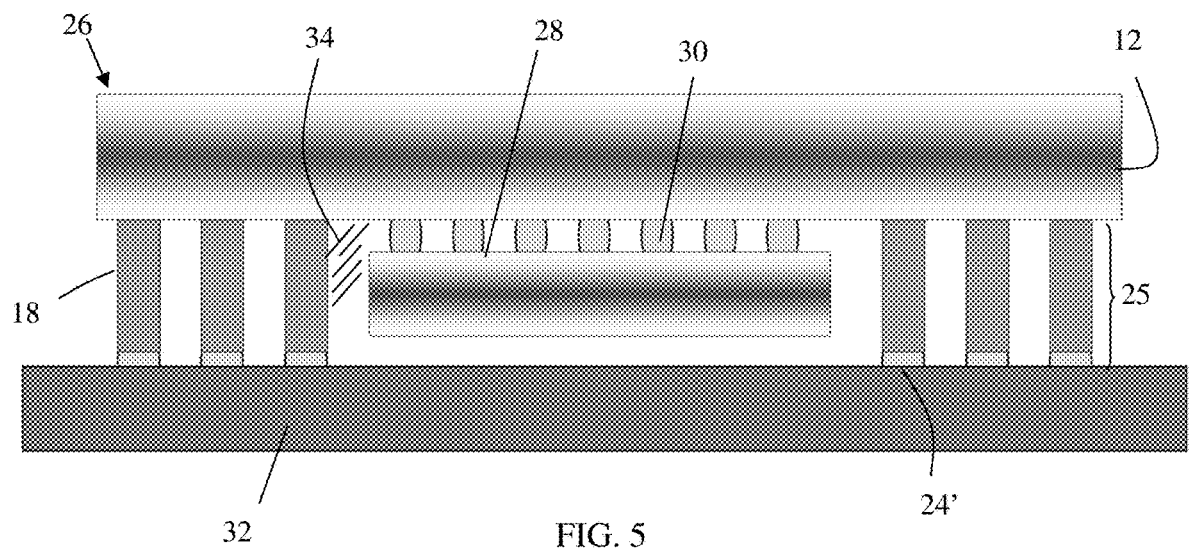

In FIG. 5, a chip 28 is bonded to the chip 26 between the pillars 25. In embodiments, the chip 28 includes plating of micro-bumps consisting of either traditional C4 or copper pillars designated at reference numeral 30. The chip 28 can be bonded to the substrate 12 by a reflow of the C4 solder connection or thermocompression bonding connection, on a same side of the chip 26 as the pillars 25. The chip 26 is then joined to a laminate, e.g., board 32, by the solder cap 24' (with the chip 28 bonded between the pillars 25). In embodiments, the board 32 can be an organic laminate and the bonding can be provided by a reflow of the solder cap 24' at a reflow temperature of less than 300° C. and more specifically at a temperature which will not melt the copper pillar, e.g., about 250° C. to about 260° C.

In embodiments, due to the increased height of the pillars 25, the pillars 25 can be used to provide stress relieve (e.g., absorb stress) resulting from coefficient thermal expansion (CTE) mismatch between the chip 26 and the board 32. Drop test results will also be improved by the increased pillar height. That is, the pillars 25 will provide strain reduction. In optional embodiments, an underfill 34 can be added for improved reliability; that is, an epoxy or other paste 34 can provided between the chip 28, chip 26 and board 32.

Figure 6:
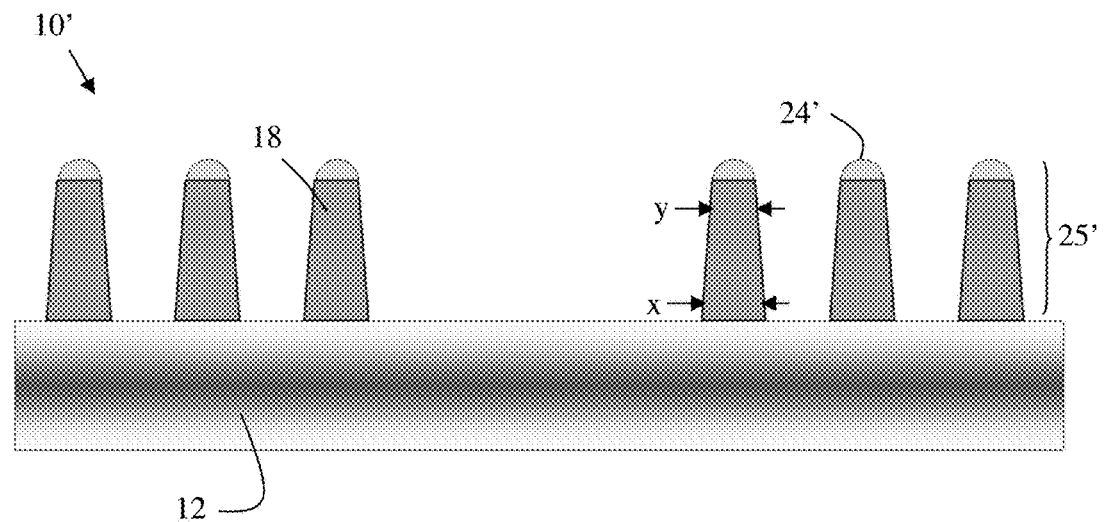
FIG. 6 shows fabrication processes and a respective structure in accordance with additional aspects of the invention.

FIG. 6 shows fabrication processes and a respective structure in accordance with additional aspects of the invention. In this structure 10', the pillars 25' can be cone or tapered shaped with a larger diameter "x" at the base and a narrower section "y" at the solder cap 24'. In embodiments, the ratio of x:y can be about 2:1. The shape of the pillars 25' can further reduce the stress in the chip back end of the line (BEOL) by increasing the area of chip interconnect and increasing bump height, while enabling increased routing density in the laminate (board 32). As shown and described with respect to FIG. 5, a chip 28 is bonded to the chip 26 between the pillars 25, and the chip 26 is then joined to a laminate, e.g., board 32, by the solder cap 24' (with the chip 28 bonded between the pillars 25).

Figure 7:
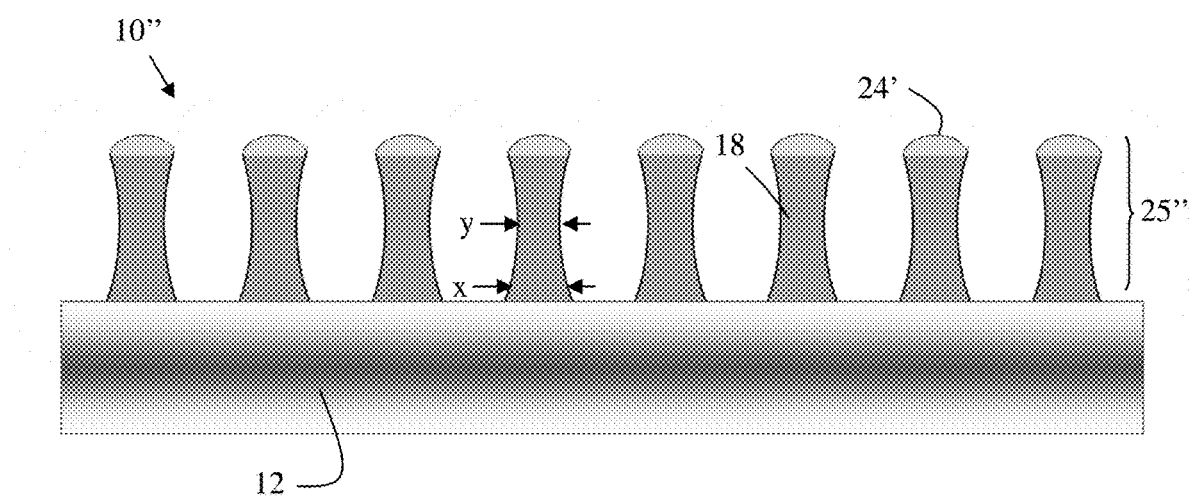
FIG. 7 shows fabrication processes and a respective structure in accordance with additional aspects of the invention.

FIG. 7 shows fabrication processes and a respective structure in accordance with additional aspects of the invention. In this structure 10", the pillars 25" can have a concave shape (e.g., hourglass shape), with a larger diameter at both the base and the solder cap 24', designated at "x" and a narrower section "y" therebetween. In embodiments, the ratio of x:y can be about 2:1. The shape of the pillars 25" distributes the bump stress more uniformly across the copper pillar 25" while maintaining a large interconnect to both the chip 26 and the laminate (board) 32. As shown and described with respect to FIG. 5, a chip 28 is bonded to the chip 26 between the pillars 25, and the chip 26 is then joined to a laminate, e.g., board 32, by the solder cap 24' (with the chip 28 bonded between the pillars 25).

Accordingly, by using the processes and resultant structures described herein, it is now possible to tailor the shapes of the pillars to accommodate bending of the pillars, thus relieving stress within the structure due to CTE mismatch. In addition, the processes described can provide complex shapes and increase the height to width ratio to about 5:1, which is not feasible or even possible with conventional plating processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    placing a plurality of layers of powder on a wafer;
    sintering each layer of the powder to form a plurality of pillars directly in contact with the wafer;
    repeating the placing and sintering steps until the plurality of pillars reach a predetermined height;
    forming a solder cap on the plurality of pillars;
    removing non-sintered powder;
    joining the wafer to an organic laminate board using a reflow process;
    joining a chip without pillars to the wafer, between the pillars, by a reflow process; and
    underfilling empty spaces between the chip, the wafer and the board, wherein:
    the wafer is diced to form a plurality of diced chips with the pillars;

the joining of the chip to the wafer is a bonding of the chip without the pillars to at least one of the diced chip with the pillars between the pillars of the diced chip;

the chip without the pillars is bonded to the diced chip with the pillars, without the use of the pillars but with micro-bumps; and the organic laminate board is bonded to the diced chip by the pillars by a reflow of the solder cap.

2. The method of claim 1, wherein:
the powder is a copper powder;
the solder cap is formed by a powder deposition followed by a sintering process; and
the sintering is a laser sintering process.

3. The method of claim 1, further comprising removing any non-sintered powder from the wafer, prior to the joining the diced chip to the organic laminate board.

4. The method of claim 1, wherein the predetermined height of the plurality of pillars is greater than 75 µm.

5. The method of claim 4, wherein the predetermined height of the plurality of pillars is about 500 µm.

6. The method of claim 1, wherein a reflow temperature is about 250° C. to about 260° C.

7. The method of claim 1, wherein:
the removing non-sintered powder is a cleaning process; and
the placing is a coating of the plurality of layers of the powder, followed by laser sintering after each coating to form the pillars directly in contact with the wafer.

8. The method of claim 1, wherein the plurality of pillars are tapered.

9. The method of claim 1, wherein the plurality of pillars are shaped as an hourglass.

10. A method, comprising:
coating a wafer with a plurality of layers of conductive powder, followed by a laser sintering after each coating to form conductive pillars directly in contact with the wafer;
forming a solder cap, on the conductive pillars;
removing non-sintered powder;
joining a chip to the wafer with microbumps and between the conductive pillars;
joining the wafer to a board by a bonding process of the solder cap of the conductive pillars to the board;
the wafer is diced to form a plurality diced chips with the conductive pillars;
the chip without the conductive pillars is bonded to one of the diced chips with the conductive pillars between the conductive pillars; and
the chip devoid of the conductive pillars is bonded to the diced chip with the conductive pillars by a reflow process of the microbumps or thermocompression bonding;
wherein the board is an organic laminate and the organic laminate is bonded to the diced chip by the conductive pillars by a reflow of the solder cap.

11. The method of claim 10, wherein the conductive powder is copper and the solder cap is formed by: deposited solder powder, sintering the solder powder and reflowing the sintered solder powder.

12. The method of claim 10, wherein the predetermined height is greater than 75 µm.

13. The method of claim 12, wherein the predetermined height is approximately 500 um.

14. The method of claim 10, further comprising underfilling spaces between the chip, the diced chip and the board.

15. The method of claim 10, wherein the conductive pillars are shaped as one of (i) cones with its bases being wider in diameter than its end at the solder cap, and (ii) hourglasses.

* * * * *